United States Patent
Chou et al.

(10) Patent No.: US 10,826,493 B1
(45) Date of Patent: Nov. 3, 2020

(54) GATE DRIVING CIRCUIT FOR PROVIDING HIGH DRIVING VOLTAGE

(71) Applicants: Yi-Chung Chou, Taipei (TW); Chih-Yuan Kuo, New Taipei (TW); Dong-Shan Chen, Hsinchu County (TW)

(72) Inventors: Yi-Chung Chou, Taipei (TW); Chih-Yuan Kuo, New Taipei (TW); Dong-Shan Chen, Hsinchu County (TW)

(73) Assignee: ITE Tech. Inc., Hsinchu (TW)

( * ) Notice: Subject to any disclaimer, the term of this patent is extended or adjusted under 35 U.S.C. 154(b) by 0 days.

(21) Appl. No.: 16/856,038

(22) Filed: Apr. 23, 2020

(30) Foreign Application Priority Data

Mar. 13, 2020 (TW) .............................. 109108469 A

(51) Int. Cl.
*H03K 17/687* (2006.01)
*G09G 3/36* (2006.01)

(52) U.S. Cl.
CPC ....... *H03K 17/6872* (2013.01); *G09G 3/3648* (2013.01); *G09G 2330/02* (2013.01)

(58) Field of Classification Search
CPC .......................... H03K 17/6872; G09G 3/3648
USPC .................. 327/108–112, 427, 434, 437, 543
See application file for complete search history.

(56) References Cited

U.S. PATENT DOCUMENTS

| 5,243,236 A | | 9/1993 | McDaniel | |
|---|---|---|---|---|
| 5,825,640 A | * | 10/1998 | Quigley | ................ H03L 7/0895 363/60 |
| 6,157,223 A | * | 12/2000 | Blake | ................ H03K 3/356113 327/108 |
| 6,316,977 B1 | * | 11/2001 | Sargeant | ............... H03L 7/0896 327/157 |

(Continued)

FOREIGN PATENT DOCUMENTS

| TW | 200533066 | 10/2005 |
|---|---|---|
| TW | 201433910 | 9/2014 |
| TW | 201742345 | 12/2017 |

OTHER PUBLICATIONS

"Office Action of Taiwan Counterpart Application", dated Jul. 2, 2020, p. 1-p. 7.

*Primary Examiner* — Tomi Skibinski
(74) *Attorney, Agent, or Firm* — JCIPRNET

(57) ABSTRACT

A gate driving circuit for providing a high driving voltage includes a first N-type high-voltage transistor and a second N-type high-voltage transistor connected in series between a driving voltage output node and a system low-voltage source. A voltage difference between a system high-voltage source and the system low-voltage source is greater than a withstand voltage of the first or second N-type high-voltage transistor. When the driving voltage output node is to output a system high voltage, the first N-type high-voltage transistor and the second N-type high-voltage transistor are turned off. Deep N-type well regions of the first N-type high-voltage transistor and the second N-type high-voltage transistor are applied with a first bias voltage. A voltage differ- (Continued)

ence between the first bias voltage and the system low-voltage source is smaller than an interface breakdown voltage between the deep N-type well region and a P-type well region of the second N-type high-voltage transistor.

9 Claims, 2 Drawing Sheets

(56) References Cited

U.S. PATENT DOCUMENTS

| | | | | |
|---|---|---|---|---|
| 8,724,353 | B1* | 5/2014 | Giuliano | H02M 3/07 363/60 |
| 2002/0186058 | A1* | 12/2002 | Prodanov | H03K 19/00315 327/108 |
| 2007/0001735 | A1* | 1/2007 | Muhlbacher | H03F 3/217 327/218 |
| 2014/0125398 | A1* | 5/2014 | Li | H03K 19/01750 327/333 |
| 2014/0333370 | A1* | 11/2014 | Itonaga | G05F 3/205 327/541 |

* cited by examiner

GATE DRIVING CIRCUIT FOR PROVIDING HIGH DRIVING VOLTAGE

CROSS-REFERENCE TO RELATED APPLICATION

This application claims the priority benefit of Taiwan application no. 109108469, filed on Mar. 13, 2020. The entirety of the above-mentioned patent application is hereby incorporated by reference herein and made a part of this specification.

BACKGROUND

Technical Field

The disclosure relates to a gate driving circuit, and more particularly, to a gate driving circuit which provides a high driving voltage.

Description of Related Art

With the development of display technology, more and more products require higher voltages to drive display panels. Specifically, a conventional thin film transistor liquid crystal display (TFT-LCD) may only require a driving voltage of ±15V (volts). However, products that are currently under development, such as a flexible substrate gate driving circuit, an organic TFT-LCD, or an electronic paper display, may require a high driving voltage of ±20V or even ±32V. When a high driving voltage needs to be output, the gate driving circuit may require a higher voltage semiconductor process, which leads to production difficulty and high production costs. Especially, the above disadvantages become more obvious as the driving voltage increases.

SUMMARY

The disclosure provides a gate driving circuit for providing a high driving voltage, which can use a high-voltage transistor to output a driving voltage higher than the withstand voltage of the high-voltage transistor.

An embodiment of the disclosure provides a gate driving circuit for providing a high driving voltage, including a first voltage switch circuit and a second voltage switch circuit. One terminal of the first voltage switch circuit is coupled to a system high-voltage source, and another terminal of the first voltage switch circuit is coupled to a driving voltage output node. The second voltage switch circuit includes a first N-type high-voltage transistor and a second N-type high-voltage transistor connected in series between the driving voltage output node and a system low-voltage source. A voltage difference between the system high-voltage source and the system low-voltage source is greater than a withstand voltage of the first N-type high-voltage transistor or the second N-type high-voltage transistor. When the driving voltage output node is to output a system high voltage, the first voltage switch circuit is turned on, the first N-type high-voltage transistor and the second N-type high-voltage transistor are turned off, and deep N-type well regions of the first N-type high-voltage transistor and the second N-type high-voltage transistor are applied with a first bias voltage. A voltage difference between the first bias voltage and the system low-voltage source is smaller than an interface breakdown voltage between the deep N-type well region and a P-type well region of the second N-type high-voltage transistor.

Based on the above, the gate driving circuit according to the embodiment of the disclosure can provide a high driving voltage, but the gate driving circuit can be manufactured using a process voltage lower than the high driving voltage, which reduces the process burden and the production cost.

To make the aforementioned more comprehensible, several embodiments accompanied with drawings are described in detail as follows.

DESCRIPTION OF THE EMBODIMENTS

Figure 1:
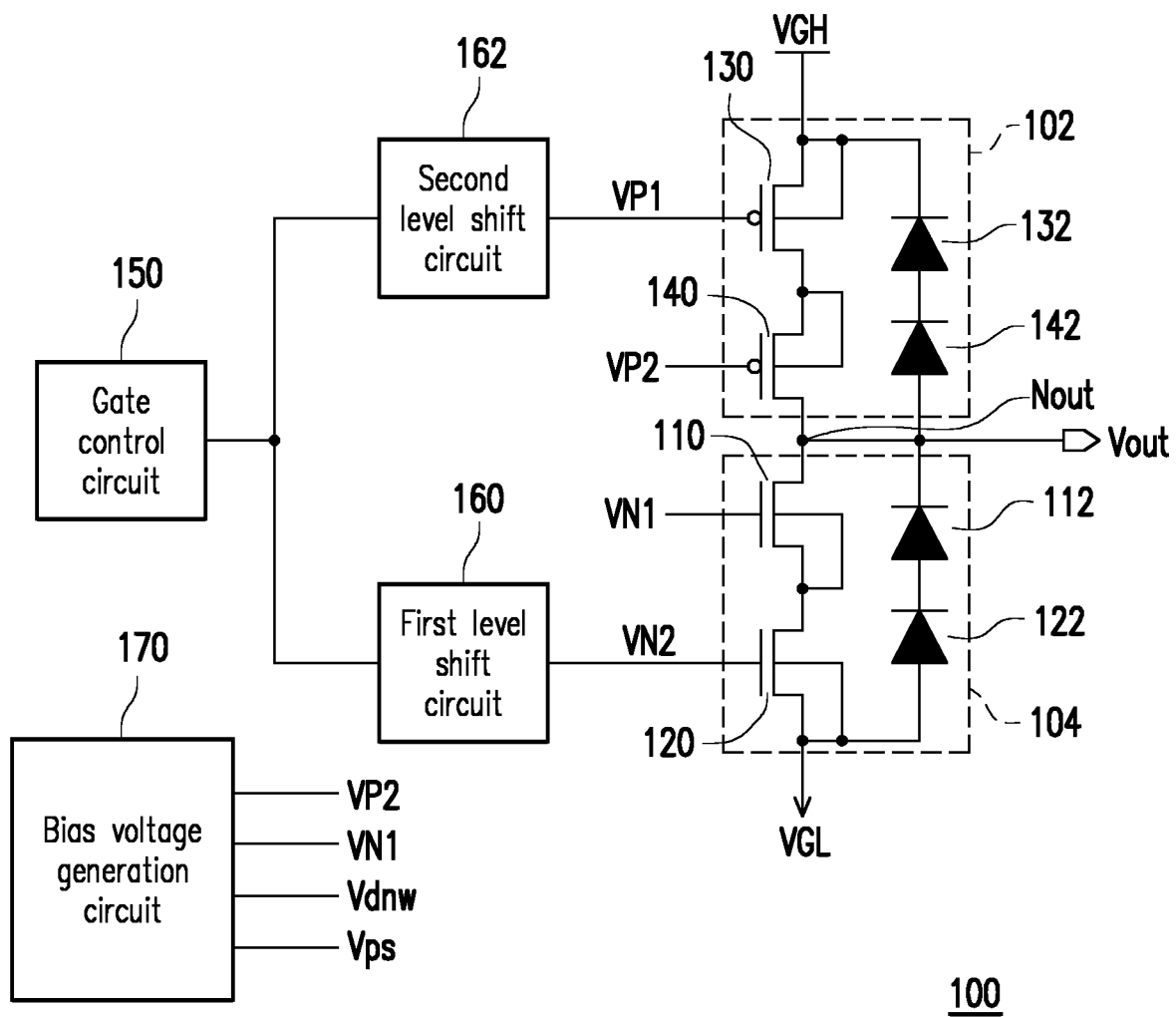
FIG. 1 is a circuit diagram showing a gate driving circuit according to an embodiment of the disclosure.

FIG. 1 is a circuit diagram showing a gate driving circuit according to an embodiment of the disclosure. Referring to FIG. 1, a gate driving circuit 100 is configured to output a high driving voltage Vout to a display panel. Here, the high driving voltage Vout is, for example, in the range of ±20V to ±32V. The gate driving circuit 100 includes a first voltage switch circuit 102 and a second voltage switch circuit 104. One terminal of the first voltage switch circuit 102 is coupled to a system high-voltage source VGH, and another terminal is coupled to a driving voltage output node Nout. One terminal of the second voltage switch circuit 104 is coupled to the driving voltage output node Nout, and another terminal is coupled to a system low-voltage source VGL. The driving voltage output node Nout is configured to output the high driving voltage Vout. When the first voltage switch circuit 102 is turned on, the second voltage switch circuit 104 is turned off, and the driving voltage output node Nout outputs the voltage value of the system high-voltage source VGH as the high driving voltage Vout. When the first voltage switch circuit 102 is turned off, the second voltage switch circuit 104 is turned on, and the driving voltage output node Nout outputs the voltage value of the system low-voltage source VGL as the high driving voltage Vout.

In this embodiment, the voltage value of the system high-voltage source VGH is 26V and the voltage value of the system low-voltage source VGL is −26V, so the gate driving circuit 100 can provide a high driving voltage Vout of ±26V.

In this embodiment, the second voltage switch circuit 104 includes a first N-type high-voltage transistor 110 and a second N-type high-voltage transistor 120. The first N-type high-voltage transistor 110 and the second N-type high-voltage transistor 120 are connected in series between the driving voltage output node Nout and the system low-voltage source VGL. In this embodiment, the first N-type high-voltage transistor 110 and the second N-type high-voltage transistor 120 have the same element characteristics.

It is noted that the voltage range of the high driving voltage Vout is wide, but the withstand voltage of the first N-type high-voltage transistor 110 and the second N-type high-voltage transistor 120 are not required to be that high. Specifically, the withstand voltage of the first N-type high-voltage transistor 110 and the second N-type high-voltage transistor 120 is, for example, 32V. In other words, the voltage difference between the system high-voltage source VGH and the system low-voltage source VGL in this embodiment is greater than the withstand voltage of the first N-type high-voltage transistor 110 or/and the second N-type high-voltage transistor 120.

Figure 2:
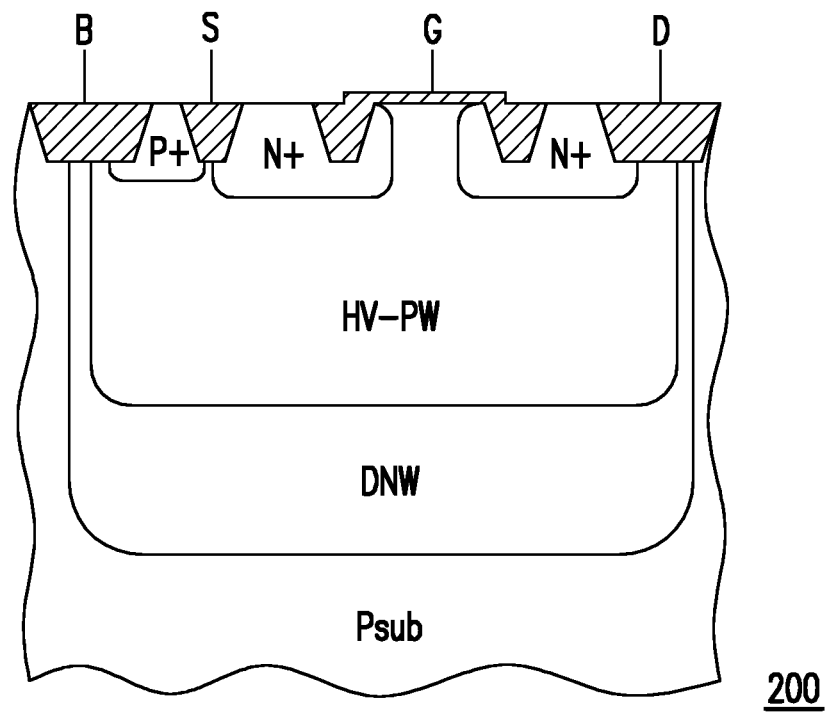
FIG. 2 is a schematic structural view showing an N-type high-voltage transistor according to an embodiment of the disclosure.

Since the first N-type high-voltage transistor 110 and the second N-type high-voltage transistor 120 of this embodiment need to be operated at a negative voltage, the semiconductor structures of the first N-type high-voltage transistor 110 and the second N-type high-voltage transistor 120 further include a layer of deep N-type well region configured to isolate a P-type well region from a P-type substrate. FIG. 2 is a schematic structural view showing an N-type high-voltage transistor according to an embodiment of the disclosure. Referring to FIG. 2, an N-type high-voltage transistor 200 may apply to the first N-type high-voltage transistor 110 and the second N-type high-voltage transistor 120. The N-type high-voltage transistor 200 includes a gate G, a drain D, a source S, and a base B as conventionally known. In the N-type high-voltage transistor 200, the region labeled with "N+" represents a doped region with a polarity of N, the region labeled with "P+" represents a doped region with a polarity of P, the region labeled with "HV-PW" represents a P-type well region for a high voltage, the region labeled with "Psub" represents a P-type substrate, and the region labeled with "DNW" represents the deep N-type well region configured to isolate the P-type well region HV-PW from the P-type substrate Psub.

Referring back to the embodiment of FIG. 1, when the driving voltage output node Nout is to output the system high voltage (the voltage value of 26V of the system high-voltage source VGH), the first voltage switch circuit 102 is turned on, and the first N-type high-voltage transistor 110 and the second N-type high-voltage transistor 120 are turned off. Specifically, at this time, the deep N-type well regions (referring to the deep N-type well region DNW in FIG. 2) of the first N-type high-voltage transistor 110 and the second N-type high-voltage transistor 120 are both applied with a first bias voltage Vdnw. The voltage difference between the first bias voltage Vdnw and the system low-voltage source VGL is smaller than the interface breakdown voltage between the deep N-type well region and the P-type well region (referring to the P-type well region HV-PW in FIG. 2) of the second N-type high-voltage transistor 120. In addition, the P-type substrates (referring to the P-type substrate Psub in FIG. 2) of the first N-type high-voltage transistor 110 and the second N-type high-voltage transistor 120 are applied with a second bias voltage Vps, and the second bias voltage Vps is smaller than or equal to the first bias voltage Vdnw. The second bias voltage Vps is used to avoid interface forward conduction between the deep N-type well region and the P-type substrate of the first N-type high-voltage transistor 110 and the second N-type high-voltage transistor 120.

More specifically, the gate driving circuit 100 may further include a gate control circuit 150, a first level shift circuit 160, a second level shift circuit 162, and a bias voltage generation circuit 170. The gate control circuit 150 is configured to output a gate control signal. The first level shift circuit 160 and the second level shift circuit 162 are coupled to the gate control circuit 150 to translate the gate control signal. Generally, the gate control signal is a low-voltage signal, and its voltage range is lower than the high driving voltage Vout. Therefore, the first level shift circuit 160 and the second level shift circuit 162 are required to shift the voltage level of the gate control signal to an appropriate magnitude. The first level shift circuit 160 translates the gate control signal to output a second control signal VN2. The second level shift circuit 162 translates the gate control signal to output a third control signal VP1. The bias voltage generation circuit 170 is configured to provide various bias voltages used in the gate driving circuit 100, such as the first bias voltage Vdnw, the second bias voltage Vps, a first control signal VN1, and a fourth control signal VP2 in FIG. 1. The bias voltage generated by the bias voltage generation circuit 170 is in the range of about ±5V.

In the first N-type high-voltage transistor 110, a first terminal is coupled to the driving voltage output node Nout, and a control terminal receives the first control signal VN1 from the bias voltage generation circuit 170. In the second N-type high-voltage transistor 120, a first terminal is coupled to a second terminal of the first N-type high-voltage transistor 110, a second terminal is coupled to the system low-voltage source VGL, and a control terminal is coupled to the first level shift circuit 160 to receive the second control signal VN2.

The first voltage switch circuit 102 includes a first P-type high-voltage transistor 130 and a second P-type high-voltage transistor 140. In this embodiment, the first P-type high-voltage transistor 130 and the second P-type high-voltage transistor 140 have the same element characteristics. In the first P-type high-voltage transistor 130, a first terminal is coupled to the system high-voltage source VGH, and a control terminal is coupled to the second level shift circuit 162 to receive the third control signal VP1. In the second P-type high-voltage transistor 140, a first terminal is coupled to a second terminal of the first P-type high-voltage transistor 130, a control terminal receives the fourth control signal VP2 from the bias voltage generation circuit 170, and a second terminal is coupled to the driving voltage output node Nout.

In this embodiment, in any of the first N-type high-voltage transistor 110 and the second N-type high-voltage transistor 120, and the first P-type high-voltage transistor 130 and the second P-type high-voltage transistor 140, the bases of the transistors are all coupled to their respective sources.

When the driving voltage output node Nout is to output the system high voltage, the second control signal VN2 is a reference low voltage, and the voltage value of the first control signal VN1 is different from the voltage value of the second control signal VN2. In this embodiment, when the driving voltage output node Nout is to output +26V, the first level shift circuit 160 translates the gate control signal (e.g., 1V) to output a second control signal VN2 of −26V (i.e., the above reference low voltage). In this embodiment, the reference low voltage is equal to the voltage of the system low-voltage source VGL.

The bias voltage generation circuit 170 generates a first control signal VN1 of −4V, so that the voltage between the first N-type high-voltage transistor 110 and the second N-type high-voltage transistor 120 is about −5V (assuming that the threshold voltage of the first N-type high-voltage transistor 110 is 1V). Accordingly, even if the cross voltage withstood by the first N-type high-voltage transistor 110 and the second N-type high-voltage transistor 120 connected in series is up to 56V (+26V to −26V), the cross voltage withstood by the first N-type high-voltage transistor 110 is only 31V and the cross voltage withstood by the second N-type high-voltage transistor 120 is only 21V, both of which are smaller than the withstand voltage of 32V.

In addition, the first bias voltage Vdnw is set at −2V, which is a negative voltage, and the second bias voltage Vps is equal to the first bias voltage Vdnw. At this time, the voltage of the P-type well region of the first N-type high-voltage transistor 110 is −26V (under the influence of the system low-voltage source VGL), and the deep N-type well region is applied with the first bias voltage Vdnw. Therefore, the voltage difference between the deep N-type well region and the P-type well region is only 24V, which is smaller than the interface breakdown voltage (assumed to be 25V) between the two. In other words, the voltage value of the first bias voltage Vdnw is smaller than the sum of the interface breakdown voltage and the voltage of the system low-voltage source VGL.

On the other hand, the voltage values of the third control signal VP1 and the fourth control signal VP2 are a voltage intermediate value between the system high-voltage source VGH and the system low-voltage source VGL. Here, the voltage intermediate value is 0V, so that both the first P-type high-voltage transistor 130 and the second P-type high-voltage transistor 140 are turned on. The second level shift circuit 162 translates the gate control signal (e.g., 1V) to output a third control signal VP1 of 0V. The bias voltage generation circuit 170 generates a fourth control signal VP2 of 0V.

The gate driving circuit 100 further includes electrostatic discharge (ESD) protection elements, which are implemented by a plurality of diodes in FIG. 1.

In this embodiment, the first voltage switch circuit 102 further includes a plurality of P-type high-voltage diodes, which are exemplified by two P-type high-voltage diodes 132 and 142 in this embodiment. The P-type high-voltage diode 132 and the P-type high-voltage diode 142 are connected in series between the system high-voltage source VGH and the driving voltage output node Nout. The second voltage switch circuit 104 further includes a plurality of N-type high-voltage diodes, which are exemplified by two N-type high-voltage diodes 112 and 122 in this embodiment. The N-type high-voltage diode 112 and the N-type high-voltage diode 122 are connected in series between the driving voltage output node Nout and the system low-voltage source VGL.

Figure 3:
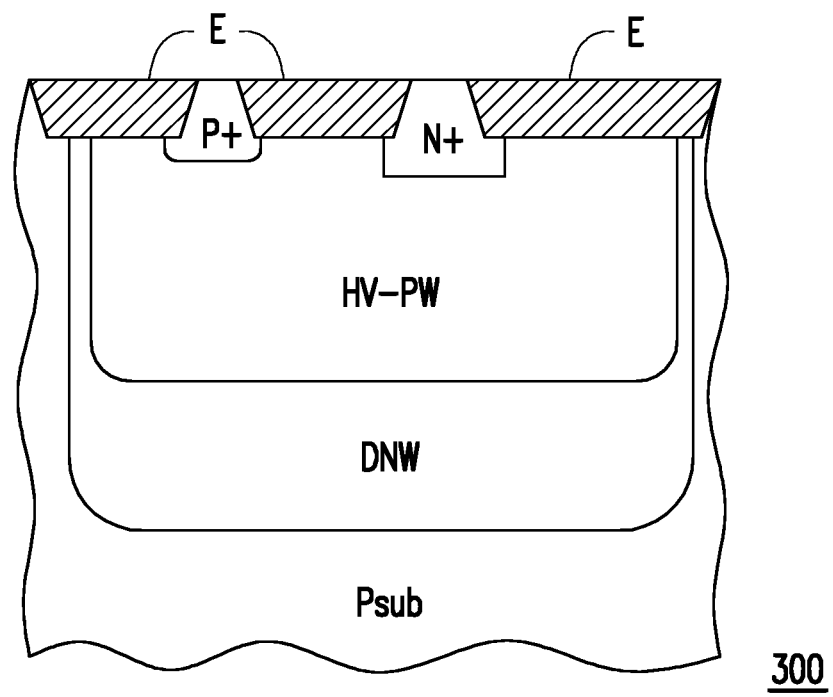
FIG. 3 is a schematic structural view showing an N-type high-voltage diode according to an embodiment of the disclosure.

Since the N-type high-voltage diode 112 and the N-type high-voltage diode 122 are operated at negative voltages, the semiconductor structures of the N-type high-voltage diode 112 and the N-type high-voltage diode 122 also include a layer of deep N-type well region. FIG. 3 is a schematic structural view showing an N-type high-voltage diode according to an embodiment of the disclosure. Referring to FIG. 3, an N-type high-voltage diode 300 may apply to the N-type high-voltage diode 112 and the N-type high-voltage diode 122. The N-type high-voltage diode 300 includes an electrode E. The labels "N+", "P+", "HV-PW", "DNW", and "Psub" have been described in the embodiment of FIG. 2 and will not be repeatedly described herein. In FIG. 3, the deep N-type well region DNW is also configured to isolate the P-type well region HV-PW from the P-type substrate Psub.

Therefore, the deep N-type well regions of the N-type high-voltage diode 112 and the N-type high-voltage diode 122 are also applied with the first bias voltage Vdnw. Similarly, in order to prevent interface forward conduction between the deep N-type well region and the P-type substrate, the P-type substrates of the N-type high-voltage diode 112 and the N-type high-voltage diode 122 are also applied with the second bias voltage Vps.

When the driving voltage output node Nout is to output the system low voltage (the voltage value of −26V of the system low-voltage source VGL), the first voltage switch circuit 102 is turned off and the second voltage switch circuit 104 is turned on. At this time, the third control signal VP1 is a reference high voltage, and the voltage value of the fourth control signal VP2 is different from the voltage value of the third control signal VP1.

The first level shift circuit 160 translates the gate control signal to output a second control signal VN2 of 0V (i.e., the above reference low voltage). The second level shift circuit 162 translates the gate control signal to output a third control signal VP1 of 26V.

The bias voltage generation circuit 170 generates a fourth control signal VP2 of 0V, so that the voltage between the first P-type high-voltage transistor 130 and the second P-type high-voltage transistor 140 is about 1V (assuming that the threshold voltage of the first P-type high-voltage transistor 130 is 1V). Accordingly, even if the cross voltage withstood by the first P-type high-voltage transistor 130 and the second P-type high-voltage transistor 140 connected in series is up to 56V (+26V to −26V), the cross voltage withstood by the first P-type high-voltage transistor 130 is only 25V and the cross voltage withstood by the second P-type high-voltage transistor 140 is only 27V, both of which are smaller than the withstand voltage of 32V.

The first control signal VN1 may still be −4V or may be another magnitude, as long as the first N-type high-voltage transistor 110 is normally turned on.

In summary of the above, the embodiments of the disclosure provide a gate driving circuit which provides a high driving voltage. By providing a first bias voltage of an appropriate magnitude to the deep N-type well region of the N-type high-voltage semiconductor device, multiple high-voltage transistors may be connected in series to output a high driving voltage.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A gate driving circuit for providing a high driving voltage, comprising:
   a first voltage switch circuit, wherein one terminal of the first voltage switch circuit is coupled to a system high-voltage source, and another terminal of the first voltage switch circuit is coupled to a driving voltage output node; and
   a second voltage switch circuit comprising:
      a first N-type high-voltage transistor and a second N-type high-voltage transistor connected in series between the driving voltage output node and a system low-voltage source,
   wherein a voltage difference between the system high-voltage source and the system low-voltage source is greater than a withstand voltage of the first N-type high-voltage transistor or the second N-type high-voltage transistor,
   wherein when the driving voltage output node is to output a system high voltage, the first voltage switch circuit is turned on, the first N-type high-voltage transistor and the second N-type high-voltage transistor are turned off, and deep N-type well regions of the first N-type high-voltage transistor and the second N-type high-voltage transistor are applied with a first bias voltage, wherein a voltage difference between the first bias voltage and the system low-voltage source is smaller than an interface breakdown voltage between the deep N-type well region and a P-type well region of the second N-type high-voltage transistor.

2. The gate driving circuit according to claim 1, wherein P-type substrates of the first N-type high-voltage transistor and the second N-type high-voltage transistor are applied with a second bias voltage, wherein the second bias voltage is smaller than or equal to the first bias voltage.

3. The gate driving circuit according to claim 1, wherein the second voltage switch circuit further comprises:
   a plurality of N-type high-voltage diodes connected in series between the driving voltage output node and the system low-voltage source, wherein deep N-type well regions of the N-type high-voltage diodes are also applied with the first bias voltage.

4. The gate driving circuit according to claim 1, wherein a first terminal of the first N-type high-voltage transistor is coupled to the driving voltage output node, and a control terminal of the first N-type high-voltage transistor receives a first control signal, and
   a first terminal of the second N-type high-voltage transistor is coupled to a second terminal of the first N-type high-voltage transistor, a second terminal of the second N-type high-voltage transistor is coupled to the system low-voltage source, and a control terminal of the second N-type high-voltage transistor receives a second control signal,
   wherein when the driving voltage output node is to output the system high voltage, the second control signal is a reference low voltage, and a voltage value of the first control signal is different from a voltage value of the second control signal.

5. The gate driving circuit according to claim 4, wherein the first voltage switch circuit comprises:
   a first P-type high-voltage transistor, wherein a first terminal of the first P-type high-voltage transistor is coupled to the system high-voltage source, and a control terminal of the first P-type high-voltage transistor receives a third control signal; and
   a second P-type high-voltage transistor, wherein a first terminal of the second P-type high-voltage transistor is coupled to a second terminal of the first P-type high-voltage transistor, a control terminal of the second P-type high-voltage transistor receives a fourth control signal, and a second terminal of the second P-type high-voltage transistor is coupled to the driving voltage output node,
   wherein when the driving voltage output node is to output the system high voltage, voltage values of the third control signal and the fourth control signal are a voltage intermediate value between the system high-voltage source and the system low-voltage source.

6. The gate driving circuit according to claim 5, wherein when the driving voltage output node is to output a system low voltage, the third control signal is a reference high voltage, and the voltage value of the fourth control signal is different from the voltage value of the third control signal.

7. The gate driving circuit according to claim 6, further comprising:
   a bias voltage generation circuit configured to provide the first bias voltage, a second bias voltage, the first control signal, and the fourth control signal.

8. The gate driving circuit according to claim 5, further comprising:
   a first level shift circuit configured to translate a gate control signal to output the second control signal; and
   a second level shift circuit configured to translate the gate control signal to output the third control signal.

9. The gate driving circuit according to claim 5, wherein the first voltage switch circuit further comprises:
   a plurality of P-type high-voltage diodes connected in series between the system high-voltage source and the driving voltage output node.

* * * * *